United States Patent [19]
Fujita et al.

[11] Patent Number: 5,126,115
[45] Date of Patent: Jun. 30, 1992

[54] PROCESS AND APPARATUS FOR PREPARATION OF SINGLE CRYSTAL OF BIOPOLYMER

[75] Inventors: Shozo Fujita, Atsugi; Koji Asano, Ebina; Takafumi Hashitani, Atsugi, all of Japan

[73] Assignee: Fujitsu Limited, Kawasaki, Japan

[21] Appl. No.: 605,352

[22] Filed: Oct. 30, 1990

Related U.S. Application Data

[62] Division of Ser. No. 263,242, Oct. 27, 1988, Pat. No. 4,990,216.

[30] Foreign Application Priority Data

Oct. 27, 1987 [JP] Japan ................. 62-269411
Oct. 27, 1987 [JP] Japan ................. 62-269413
Jul. 5, 1988 [JP] Japan ................. 63-168490

[51] Int. Cl.$^5$ ............................................. B01D 9/00
[52] U.S. Cl. ................. 422/253; 23/295 R; 422/245
[58] Field of Search ............... 422/245, 253; 23/295 R

[56] References Cited

U.S. PATENT DOCUMENTS 2,569,357 9/1951 Vahl ..................... 23/292 R
4,263,010 4/1981 Randolph ............... 422/245
4,755,363 7/1988 Fujita et al. ............ 422/245

FOREIGN PATENT DOCUMENTS

106000 5/1987 Japan .
0671166 8/1989 Switzerland ............ 23/295 R

Primary Examiner—Robert Kunemund
Assistant Examiner—Felisa Garrett
Attorney, Agent, or Firm—Staas & Halsey

[57] ABSTRACT

A process for the preparation of a single crystal of a biopolymer by growth from a solution, which comprises continuously changing one factor having an influence on the conditions for crystallization of a solution of a biopolymer, fractionating the solution, and independently crystallizing the resultant fractions. The process may be carried out by an apparatus comprising a means for feeding a crystallizing agent solution, a means for feeding a biopolymer solution, a means for producing a series of changes of predetermined crystallization conditions, said means continuously changing at least one factor having an influence on the conditions for crystallization of the biopolymer solution, and means for fractionating the solution and independently crystallizing the resultant fractions.

10 Claims, 8 Drawing Sheets

PROCESS AND APPARATUS FOR PREPARATION OF SINGLE CRYSTAL OF BIOPOLYMER

This is a divisional of copending application Ser. No. 07/263,242 filed on Oct. 27, 1988 now U.S. Pat. No. 4,990,216.

BACKGROUND OF THE INVENTION

1. Field of the Invention

The present invention relates to a process and apparatus for the preparation of a single crystal of a biopolymer. More particularly, the present invention relates to a process and apparatus for preparing a single crystal of a biopolymer by growth from a solution.

2. Description of the Related Art

The preparation of a single crystal of a biopolymer such as a protein by growth from a solution is an important technique applied in protein engineering or drug design.

To induce crystallization, an aqueous solution of ammonium sulfate, methylpentanediol or polyethylene glycol is added to an aqueous solution of a biopolymer, to be crystallized, the precipitated high polymer is allowed to stand, and the formation of a crystal nucleus and growth of a crystal are effected by the solution growth method. In this connection, various methods for the precipitation of a biopolymer are known [Lecture on Biochemical Experiments, Volume 1-III, pages 6–17 published by Tokyo Kagaku Dojin in 1976].

Nevertheless, since setting of crystallization conditions must be precise, crystallization is conducted under a variety of conditions to determine the optimum conditions, and since a manual operation for finding out optimum conditions is carried out, it is difficult to maintain a good reproducibility. Accordingly, the present inventors previously proposed a method of automatically performing this operation (see Japanese Unexamined patent Publication No. 62-106000). But in this system, where a solution path is changed according to which of many crystallization conditions is used, by a valve, the dead volume of the pipe system is increased and much valuable protein sample is wasted. Accordingly, the above-mentioned system must be improved.

SUMMARY OF THE INVENTION

A primary object of the present invention is to provide a process and apparatus for preparing a single crystal of a biopolymer by growth from a solution, in which the optimum conditions for crystallization of a biopolymer can be easily and efficiently determined by using a small amount of a sample.

More specifically, in accordance with the present invention, there is provided a process for the preparation of a single crystal of a biopolymer by growth from a solution, which comprises continuously changing one factor having an influence on the conditions for crystallization of a solution of a biopolymer, fractionating the solution, and independently crystallizing the resultant fractions.

The present invention further provides an apparatus for the preparation of a single crystal of a biopolymer by growth from a solution, which comprises:
 a means for feeding a crystallizing agent solution;
 a means for feeding a biopolymer solution;
 a means for producing a series of changes of predetermined crystallization conditions, said means continuously changing at least one factor having an influence on the conditions for crystallization of the biopolymer solution; and,
 a means for fractionating the solution and independently crystallizing the resultant fractions.

DESCRIPTION OF THE PREFERRED EMBODIMENTS

The present invention is different from the conventional method, in which a solution is independently formed and transferred for each crystallization condition, since according to the process of the present invention, a series of changes of predetermined crystallization condition are continuously produced and the solution is fractionated to form fractions corresponding to independent conditions.

More specifically, for example, the concentration of ammonium sulfate precipitating a protein is gradually changed to form a concentration gradient, drops of the solution are collected one by one, and crystallization is carried out for the respective drops by the vapor diffusion process.

As the factor of the crystallization condition for formation of the concentration gradient, there can be utilized the concentration of a precipitating agent or crystallizing agent such as ammonium sulfate mentioned above, magnesium sulfate, sodium sulfate, sodium phosphate, sodium chloride, cesium chloride, methylpentanediol, methanol or acetone, the protein concentration, the pH value (hydrogen ion concentration), the concentration of a substance, the presence of which increases the regularity of the crystal, for example, an inorganic salt such as sodium sulfate, cesium chloride or aluminum chloride, and the concentration of a substance specifically bonding with a protein, for example, an enzyme reaction inhibitor.

As the fractionating and crystallizing means, there can be mentioned a method in which the solution is charged and sealed in, for example, screw-mouth bottles having a small capacity, and crystallization is carried out batchwise in each respective bottles by standing (FIG. 1), and a method in which drops are received on small glass sheets and crystallization is effected by the vapor diffusion method.

Figure 1:
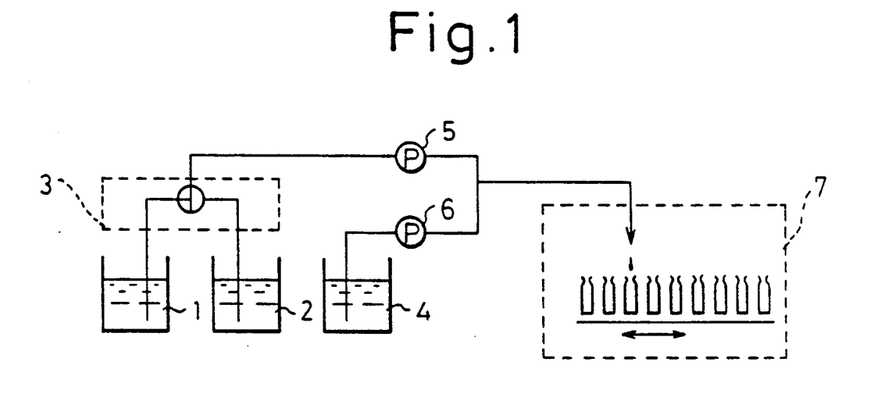
FIG. 1 is a diagram illustrating a first embodiment of the apparatus for carrying out the process of the present invention.
Figures 2, 3:
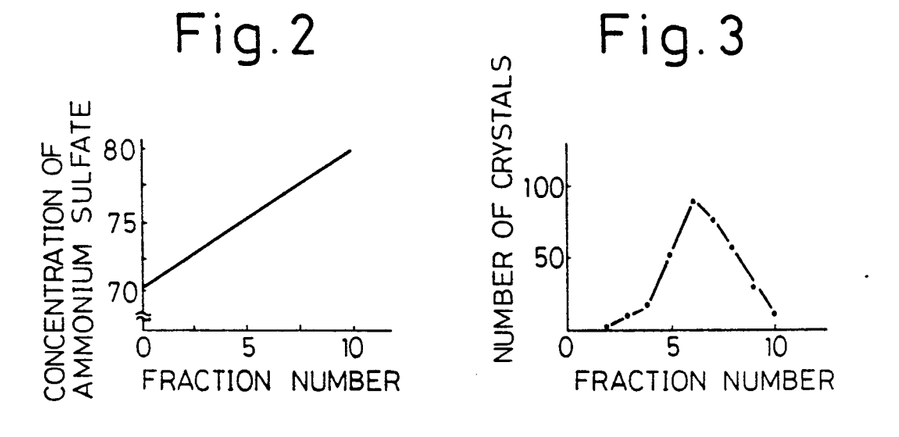
FIGS. 2 and 3 are graphs illustrating the ammonium sulfate concentration gradient and the number of crystals formed in examples of the present invention.

An example of the structure of the apparatus for carrying out the process of the present invention is shown in FIG. 1. In this example, an ammonium sulfate solution 1 (ammonium sulfate concentration=80% of the saturation concentration, 10 mM sodium phosphate buffer, pH=7.0) and an ammonium sulfate solution 2 (ammonium sulfate solution=95% of the saturation concentration, 10 mM sodium sulfate buffer, pH=7.0) are supplied to a concentration gradient-producing system 3 for a usual high-speed liquid chromatography, and a concentration gradient of from 83% saturation concentration to 95% saturation concentration is formed with a total solution amount of 3.34 ml. A separately prepared protein solution 4 (3% sperm whale myoglobin, 50% ammonium sulfate, 10 mM sodium phosphate buffer, pH=7.0) is mixed with the above solution having the concentration gradient at a volume ratio of ½. To attain this mixing ratio, the feed rates of two pumps 5 and 6 are adjusted to 0.5 ml/min and 1.0 ml/min, respectively. The formed solution contains 1% of myoglobin in 10 mM sodium phosphate and has a pH value of 7, and a concentration gradient in which the ammonium sulfate concentration linearly changes from 70% to 80% is formed (FIG. 2). The solution is supplied to a fraction collector 7 for the liquid chromatography, and the solution is divided into fractions, each having a volume of 0.5 ml, and charged in microvial bottles having a capacity of 1 ml. The microvial bottles are immediately sealed and stored in a thermostat tank maintained at 20° C., and thus, myoglobin solutions containing ammonium sulfate at concentrations corresponding to 70.5, 71.5, 72.5, 73.5, 74.5, 75.5, 76.5, 77.5, 78.5 and 79.5% of the saturation concentration are obtained. After 1 day, the formation of crystals is initiated and the crystals grow gradually over about 7 days. The number of crystals formed is largest at the concentration corresponding to 75.5% of the saturation concentration (FIG. 3). Namely, this concentration is an optimum concentration condition for the crystallization in the present example.

Figure 4:
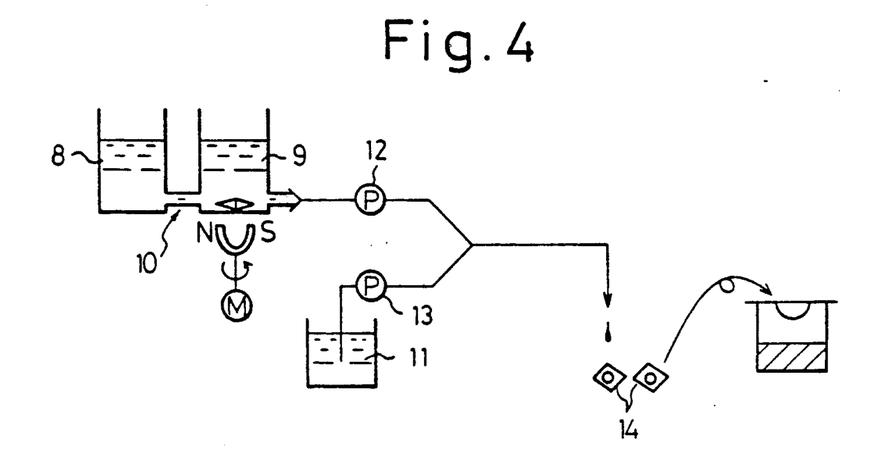
FIG. 4 is a diagram illustrating a second embodiment of the apparatus for carrying out the process of the present invention.

Another example of the structure of the apparatus for carrying out the process of the present invention is shown in FIG. 4. In this example, a protein solution 8 (3% sperm whale myoglobin, 60% saturation ammonium sulfate, 10 mM sodium phosphate buffer, pH=7.0) and a protein solution 9 (0.75% sperm whale myoglobin, 60% saturation ammonium sulfate, 10 mM sodium phosphate buffer, pH=7.0) are supplied to a gradient-forming device 10 of an acrylic resin (supplied by Sanko Plastics Co.) and a concentration gradient is formed to a total liquid amount of 2 ml. The feed rates of two peristaltic pumps 12 and 13 are adjusted to 0.3 ml/min and 0.6 ml/min, respectively, so that a separately prepared ammonium sulfate solution 11 (80% ammonium sulfate, 1.0 mM sodium phosphate buffer, pH=7.0) is mixed with the above solution having a concentration gradient at a volume ratio of ½. The final solution contains 70% of ammonium sulfate in 10 mM sodium phosphate buffer and has a pH value of 7.0, and the myoglobin concentration changes from 0.5% to 2%. The solution is divided into fractions, each having a volume of 0.1 ml, and received on glass sheets 14, and crystallization is effected at 20° C. by the vapor diffusion method. After 3 days, the formation of crystals is initiated, and the crystals grow slowly over about 2 weeks. The number of formed crystals is largest at a myoglobin concentration of 1.5%. Namely, this concentration is an optimum myoglobin concentration for the crystallization in this example.

According to another embodiment of the present invention, as the means for fractionating and crystallizing a solution having a concentration gradient, a method is adopted in which the solution having a concentration gradient prepared in the above-mentioned manner, is guided to a soft hollow tube, the soft hollow tube is compressed at a plurality of predetermined parts to divide the tube into a plurality of small chambers, and each chamber is used as a crystal-growing vessel filled with the solution to be crystallized.

According to still another embodiment of the present invention, a plurality of blocks having a through hole are arranged close to one another to form a hollow pipe cavity defined by the through holes of the blocks, whereby a crystal-growing apparatus is constructed. The solution to be crystallized and having a concentration gradient is filled in the hollow pipe cavity, and the connection of the through holes is sealed so that the through holes are used as independent small chambers. Namely, each small chamber acts as a crystal-growing vessel filled with the solution to be crystallized.

Figure 5:
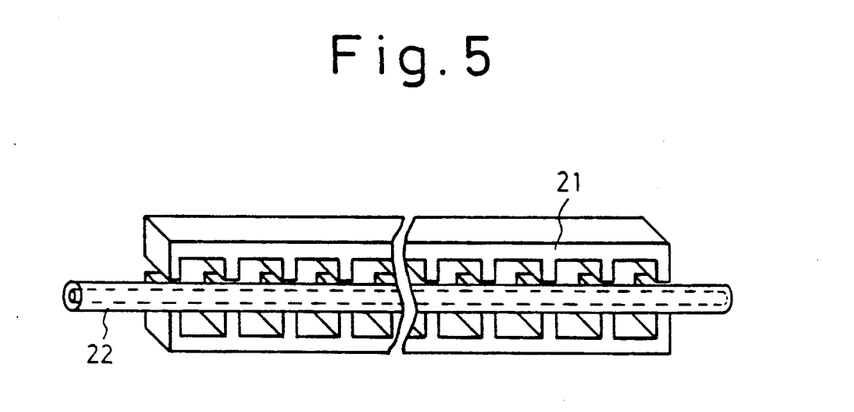
FIG. 5 is a schematic perspective view illustrating a compression tool used in the process of the present invention.
Figure 6:
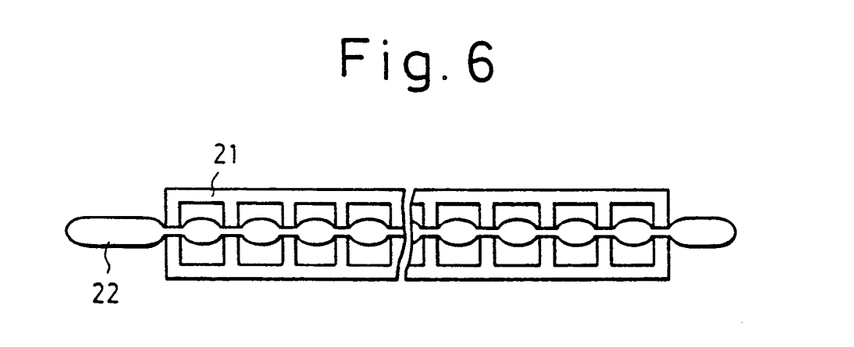
FIG. 6 is a diagram illustrating a tube when compressed by the compression tool.
Figure 7:
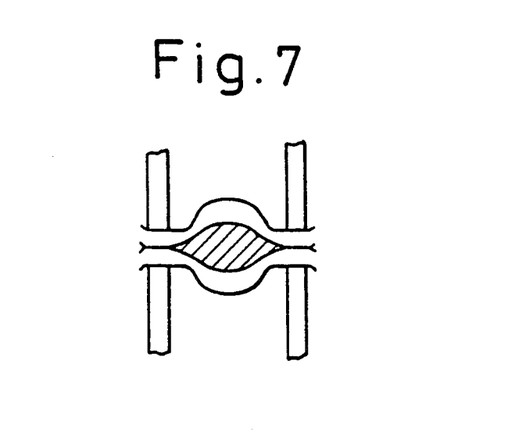
FIG. 7 is an enlarged view of a part of FIG. 6.

For compression of the soft hollow tube, for example, a compression tool 21 comprising members having the same rectangular sectional shape, as shown in FIGS. 5 and 6, can be used. For example, a soft tube 22 is supported on the compression tool 21 and the tube 22 is divided into a plurality of crystal-growing small chambers by this tool 21. This apparatus is operated in the following manner. One end of the compression tool is fixed, and four ball screws are attached to the other end so that a cantilever structure is not formed. Timing pulleys attached to one ends of the screws are driven by one motor through a timing belt to compress one side of the compression tool against the other side thereof. The terminal point is automatically detected by using a photointerrupter or the like, to stop the supply of power to the motor. A reverse revolution after the supply of power is stopped can be prevented by driving the motor through a gear.

A transparent soft hollow tube is used in the present invention, but if observation of the crystal-forming process over a period of time is not necessary, a semi-transparent or opaque tube can be used. A material having a low water permeability is preferably used as the material of the hollow tube. For example, there are advantageously used a vinyl chloride polymer marketed under the tradename of "Tygon", and fluorine-containing polymers such as a tetra-fluoroethylene/perfluoroalkyl vinyl ether copolymer (PFA), a tetra-fluoroethylene/-hexafluoropropylene copolymer (FEP), a tetrafluoroethylene/ethylene copolymer (ETFE), polytrifluorochloroethylene (PCTFE), a trifluorochloroethylene/ethylene copolymer (ECTFE), polyvinyl fluoride (PVF), polyvinylidene fluoride (PVDF), and polytetrafluoroethylene (PTFE).

The sample is introduced into the soft hollow tube of the above-mentioned apparatus from the concentration gradient-preparing apparatus, the soft hollow tube is divided into small chambers, and crystals are grown therein. The crystals are recovered by cutting off one end of the small chambers of the soft tube.

More specifically, a transparent tube having a good elasticity and a low water permeability (composed of Tygon in the present embodiment), as shown in FIG. 5, is arranged downstream of the concentration gradient-preparing apparatus as shown in FIGS. 1 or 4. A predetermined amount of the solution is fed from the concentration gradient-preparing apparatus to prepare a predetermined concentration gradient in the tube, the tube is compressed at predetermined intervals to divide the tube into small chambers, and crystals are grown and in each chamber.

A concentration gradient solution comprising 1% of myoglobin and 10 mM sodium phosphate buffer and having an ammonium sulfate concentration gradually changed from 70% to 80% is prepared in the same manner as described above with reference to FIG. 1, and the solution is guided into a Tygon tube having an inner diameter of 3 mm and a length of 8 cm. The tube is gripped by metal sheets having convexities and concavities to divide the tube into 10 small chambers at intervals of 0.8 cm. Solutions having concentrations corresponding to 70.5, 71.5, ... 79.5% of the saturation concentration are charged in the small chambers, and the growth of the crystals is carried out in a thermostat tank maintained at 20° C. while the tube is gripped thereby.

Figure 8:
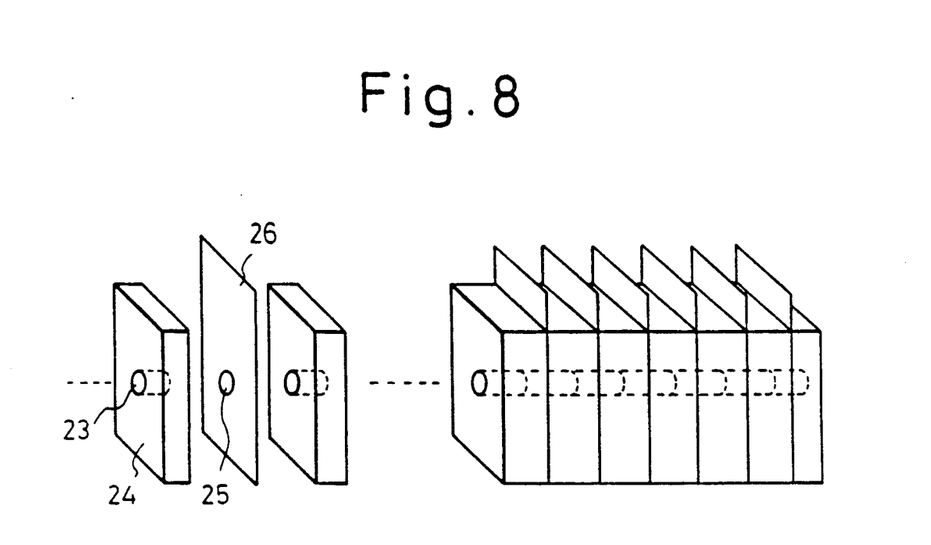
FIG. 8 is a diagram illustrating a crystal-growing apparatus according to another embodiment of the present invention.

After one day, the growth of crystals is initiated, and the crystals grow gradually over 7 days. The number of the crystals formed is largest at a concentration corresponding to 75.5% of the saturation concentration. In the present embodiment, this concentration is an optimum concentration for crystallization.

Where the soft hollow tube is formed of a fluorine-containing polymer, a hollow tube having a structure described below is very advantageously used. Namely, PFA, FEP, PVDF, PVF, and PTFE hollow tubes having a wall thickness of 0.2 to 2.0 mm and ETFE, PCTFE, and ECTFE tubes having a wall thickness of 0.2 to 1.0 mm are preferably used.

Where small chambers are formed by using a plurality of blocks, a crystal-growing apparatus shown in FIG. 8 can be used, in which a plurality of blocks 24 having a hole 23 formed at an appropriate position and a plurality of thin sheets 26 having a hole 25 corresponding to the hole 23 are arranged alternately. This crystal-growing apparatus is used, for example, in the following manner. A hole is formed at the central portion of the top end of the thin sheet gripped between the blocks, and a rod for sliding the thin sheet upward is inserted through this hole. Ball screws are arranged on both the ends of the rod. As in the above-mentioned apparatus, timing pulleys are driven by a motor through a timing belt to simultaneously slide the thin sheets 26 upward, whereby the tube hole is divided into small chambers as crystallizing vessels (see FIG. 9).

The material of the blocks may be either an inorganic material such as glass or an organic polymer such as an acrylic polymer, polymethylpentene or polycarbonate.

The thin sheets are preferably composed of a metal such as stainless steel or titanium.

For example, blocks having a thickness of at least 2 mm and this sheets having a thickness of not larger than 200 $\mu$m can be used.

Figure 9:
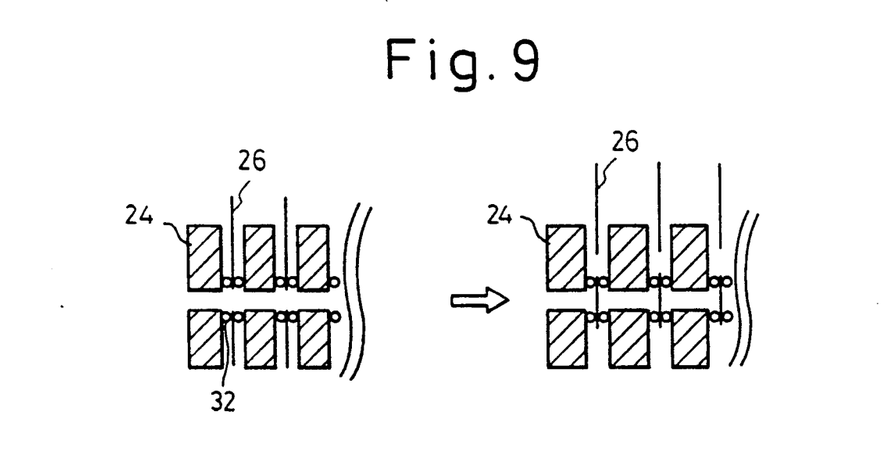
FIG. 9 is a diagram illustrating an example of the fabrication of a crystallizing vessel.

When constructing the crystal-growing apparatus of the present embodiment, a through hole is formed in each member comprising a block and a thin sheet and the members are assembled by using bolts and nuts. After crystals have been grown by the predetermined operation, the crystals are recovered, for example, in the following manner. Namely, the apparatus is vertically erected, and the bolts and nuts are removed by using a disjointing tool while all of the blocks are clamped (to prevent leakage of the solution by using such as an O-ring 32 as shown in FIGS. 9 and 10), and then the blocks are removed one by one and the crystals in the respective chambers are recovered in sequence.

For example, a tool comprising methylmethacrylate polymer (Plexiglas) blocks (having a length of 0.8 cm) having a hole having a diameter of 3 mm and stainless steel sheets (having a thickness of 50 $\mu$m) having a hole having a diameter of 3 mm, which are gripped between adjacent blocks, is used (see FIG. 8). Where the thin sheets are gripped between the acrylic resin blocks so that the holes of the blocks are in agreement with the holes of the thin sheets, the same concentration gradient solution as described above with reference to FIG. 1 is filled in the tube path, and the stainless steel sheets are slid by 10 cm to divide the tube path into 10 small chambers. In the same manner as described in the foregoing embodiments, crystals are grown for 7 days, and the formed crystals are recovered by disjointing the blocks by using the above-mentioned disjointing tool.

Figure 10:
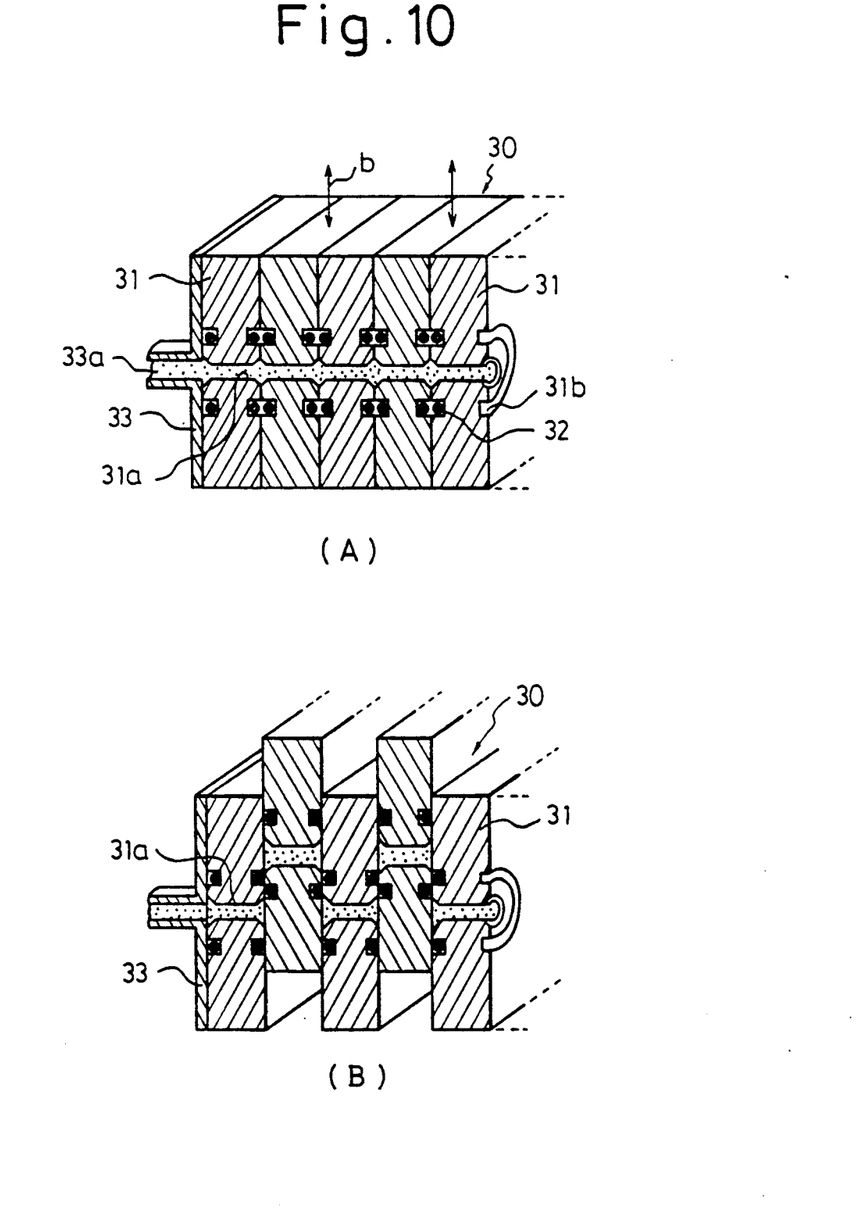
FIG. 10 is a diagram illustrating another embodiment of the process for preparing a crystal according to the present invention.

In accordance with still another embodiment of the present invention, small chambers are formed by the means illustrated in FIG. 10. FIG. 10, (A) shows the state of the tool at the step of charging the concentration gradient solution, and (B) shows the state after the division of the concentration gradient solution.

Another example of the concentration gradient solution is now given. Referring to FIG. 1, an aqueous solution of ammonium sulfate having a concentration corresponding to 95% of the saturation concentration as a concentrated solution 1, an aqueous solution of ammonium sulfate having a concentration corresponding to 72.5% of the saturation concentration as a dilute solution 2, and a protein solution 4 formed by dissolving 3% of sperm whale myoglobin in an aqueous solution of ammonium sulfate having a concentration corresponding to 50% of the saturation concentration are charged. Note, 1/15 mole/l sodium phosphate buffer (pH=7.4) is added in each solution for buffering the pH value.

The mixing device 3 is operated to form a concentration gradient solution having a concentration changed from a 72.5% saturation concentration to a 95% saturation concentration with a total liquid amount of 2 ml. The concentration gradient solution is caused to flow to the right in the drawings by the pump 5, and the protein solution 4 is caused to flow in a volume corresponding to ½ of the volume of the concentration gradient solution by the pump 6, both solutions are then mixed and the solution having a concentration gradient is fed out.

The tool 30 shown in FIG. 10 comprises a plurality of transparent block plates 31 formed of a transparent acrylic resin and having a thickness of several mm and a through hole 31a having a diameter of 2 to 3 mm, and in contact with one another. The block plates 31 are moved alternatively, for example, in the direction b (vertical to the surface of the drawing sheet) rectangular to the thickness direction by an operating member (not shown) disposed outside. Packings 32 are provided in circular grooves 31b provided around the through holes 31a at the both sides of the block plates 31, so that a seal is maintained between the opposing surfaces of the adjacent block plates.

A solution-charging port 33 is fixed to one end of the tool 30, and a hole 33a of the port 33 is formed substantially coaxially with the through hole 31a of the block plate 31.

In the state (A) where the through holes 31a of the block plates 31 are communicated with one another, the predetermined concentration gradient solution is charged into the tool 30 from the port 33, and the block plates 31 are alternately moved upward on the drawing sheet by an external mechanism not shown in the drawings to disconnect the communication of the through holes and produce the state (B).

In this divided state, the through holes 31a of the respective block plates 31 are filled with solutions having different compositions, respectively, and the solution are allowed to stand in this state in a thermostat tank maintained at about 20° C. The formation of crystal nuclei and growth of the crystals is observed from the outside.

Even if the block plates 31 are formed of a transparent glass, polymethylpentene resin or polycarbonate resin instead of the acrylic resin used in the present embodiment, similar effects can be attained, as has been experimentally confirmed.

Figure 11:
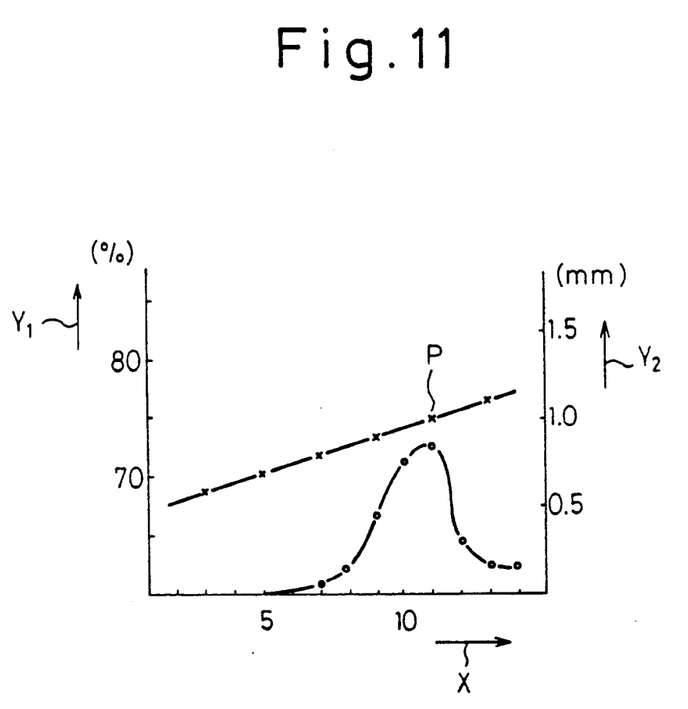
FIG. 11 is a graph illustrating the results obtained by the embodiment shown in FIG. 10.

FIG. 11 illustrates the relationship between the concentration of the concentration gradient solution and the size of crystals in each small chamber, as observed in the above-mentioned embodiment. The ammonium sulfate concentration (%) is plotted on the left ordinate Y1 and the average value (mm) of the long sides of crystals is plotted on the right ordinate Y2, and the small chamber number is shown on the abscissa X.

In the present invention, the portion in which the crystals are largest, i.e., the average value of the long sides of crystals is about 0.8 mm, is present in the vicinity of the small chamber No. 11, and the point p indicating an aqueous solution of ammonium sulfate having a concentration corresponding to 74% of the saturation concentration corresponds substantially to this portion.

Figure 12A:
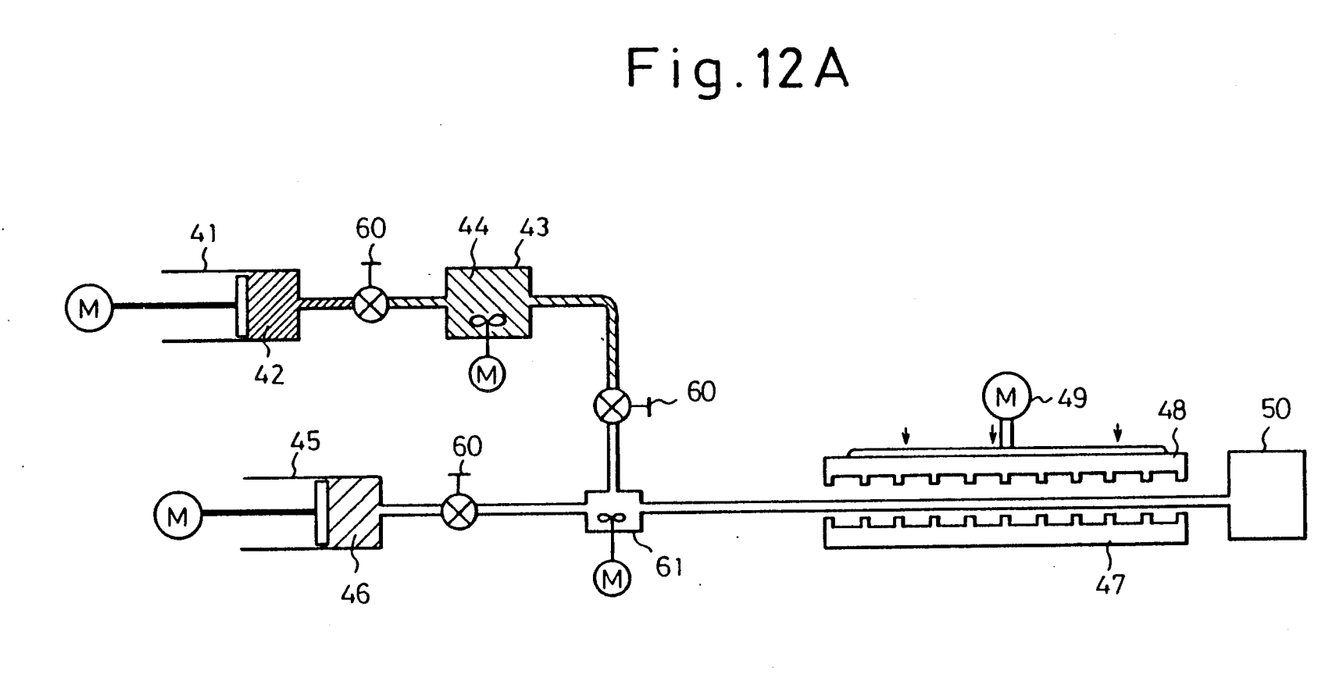
FIGS. 12A and 12B are diagrams each illustrating an example of the apparatus structure in which the process of the present invention is advantageously carried out; and, FIG. 13 is a block diagram showing the operations in the apparatus shown in FIGS. 12A and 12B.
Figure 12B:
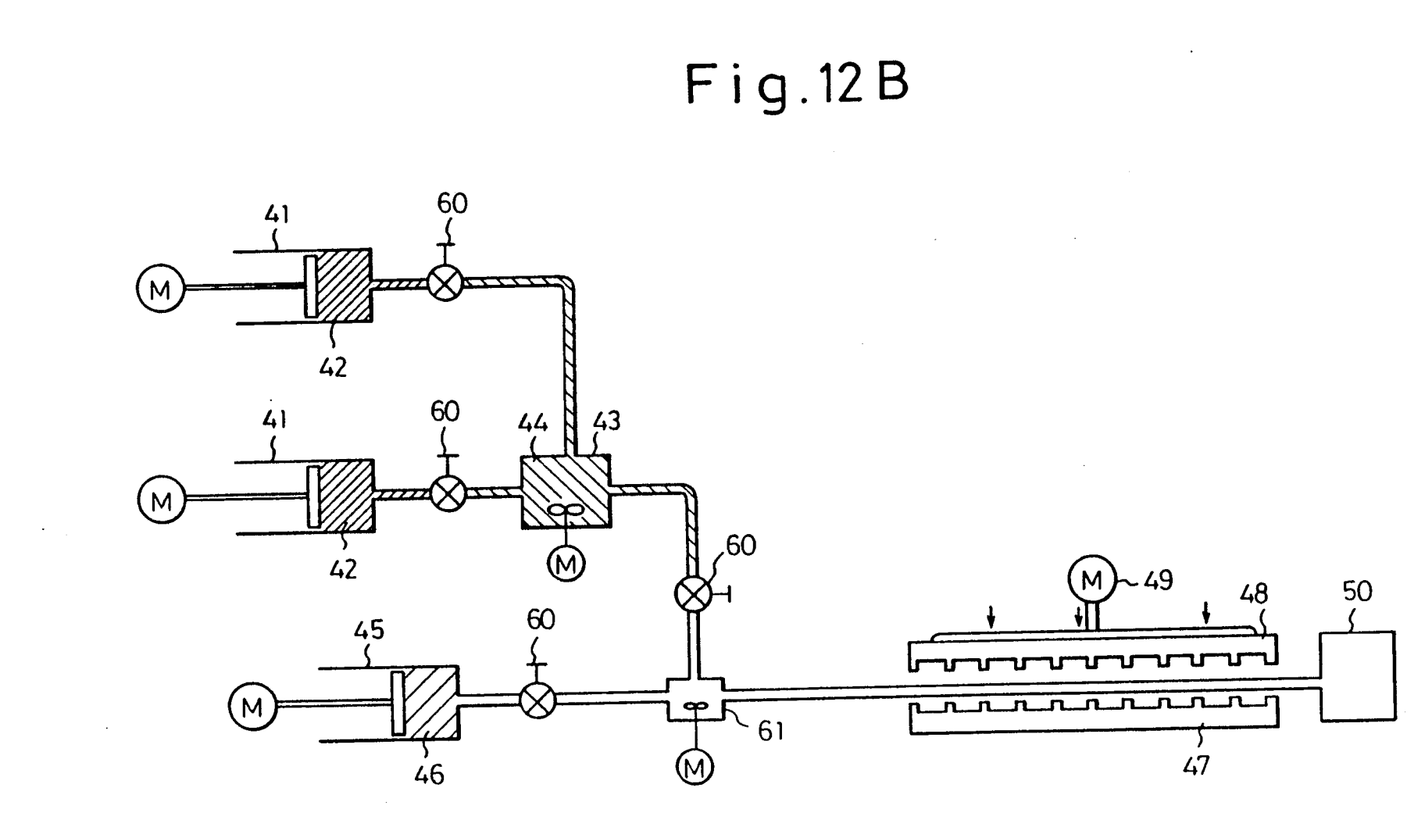
Figure 13:
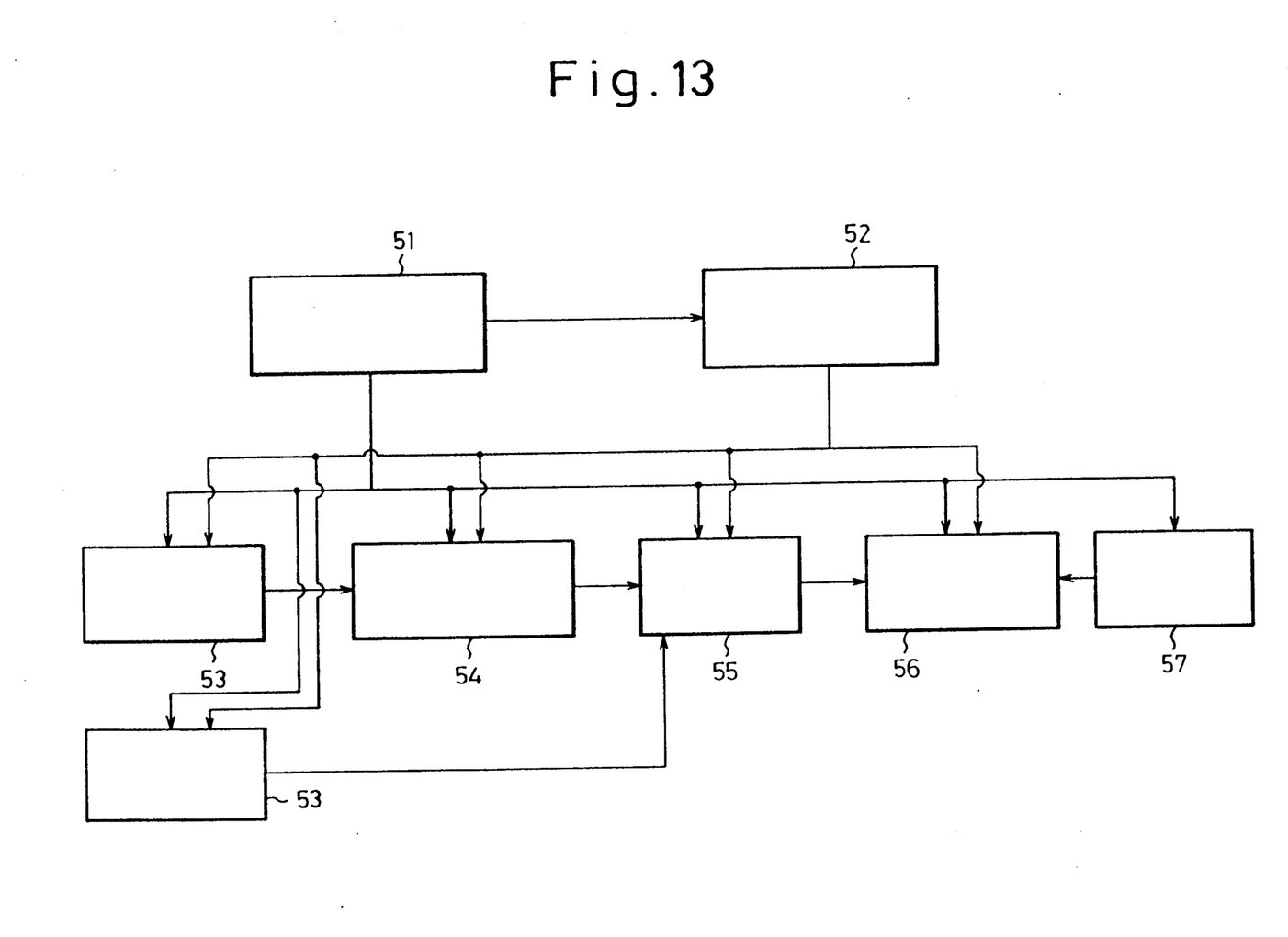

FIGS. 12A and 12B each illustrates still another embodiment of the structure of the apparatus for advantageously carrying out the process of the present invention. Referring to FIGS. 12A and 12B, a crystallizing agent solution 42 is contained in a liquid feed portion 41, and a crystallizing agent solution 44 having different factor of the crystallizing agent solution 42 is contained in a concentration gradient-forming portion 43. The crystallizing agent solution may be fed in the concentration gradient-forming portion 43 previously by a means similar to the liquid feed portion 41 mechanism. The solution 42 is fed at a constant rate from the liquid feed portion 41, whereby a predetermined concentration gradient is formed by stirring the crystallizing agent solution fed into the concentration gradient-forming portion 43 and the crystallizing agent solution 44, and simultaneously, the concentration gradient solution is fed out in sequence. A sample solution 46 is fed from a liquid feed portion 45 at a constant rate. These solutions are mixed by the stirring portion 61 to form a crystallizing agent-containing sample solution having a certain concentration gradient. The concentration gradient solution is then introduced to a crystallizing portion 47, and a compression tool 48 is driven by a tube-pressing driving portion 49 to form a plurality of sample solution-containing small chambers. Note, reference numeral 50 represents a drain vessel and reference numeral 60 represents valves. FIG. 13 is a block diagram showing the operations in the apparatus shown in FIG. 12. In FIG. 13, 51 represents a control portion, 52 represents a temperature-controlling portion, 53 represents a solution reserve and feed portion, 54 represents a concentration gradient-forming portion, 55 represents a solution reserve and feed portion, 56 represents a crystallizing portion and 57 represents a tube-pressing driving portion. The arrow from the portion 51 indicates the stream of a command for causing a coordinated action of the respective portions. It is important that the portions 53, 54, 55, 56 and 57 act correlatively. The arrows from 52 indicate the streams of commands for appropriately controlling the temperatures of the respective portions. The arrows from the portion 53 to the portion 54 (or 55), 54 to 55, and 55 to 56 indicate the streams of the solution. The arrow from the portion 57 to the portion 56 indicates the driving force for compressing the tube.

The process and apparatus of the present invention can be applied not only for terrestrial experiments but also for cosmical experiments.

We claim:

1. An apparatus for optimizing the conditions for preparing single biopolymer crystals by growth from a solution, comprising:

an elongated, hollow chamber;

means for filling said chamber with a solution of a biopolymer substance and an active substance capable of influencing the crystallization of the biopolymer substance as a single crystal to thereby present an elongated column of said solution in said chamber;

means for distributing one of said substances in the solution in such a way that the concentration of the distributed substance in the solution changes linearly along the length of the column of solution; and means for dividing the column of solution into a plurality of lengths and physically separating said lengths from one another before substantial crystal growth occurs in said solution, whereby said lengths of solution each have a different concentration of said one of said substances therein during crystal growth.

2. An apparatus as set forth in claim 1, wherein said chamber comprises a tube and said apparatus includes means for moving said solution along the tube to a delivery point, and said means for dividing comprises means for causing said lengths of solution to be delivered at said point to respective, separate reaction receptacles.

3. An apparatus as set forth in claim 1, wherein said chamber comprises a soft hollow tube and said means for dividing comprises means for compressing the tube at a plurality of positions to present a plurality of small chambers, each containing a separate length of said solution.

4. An apparatus as set forth in claim 1, wherein said chamber comprises a linear series of hollow containers that are interconnected by through holes, and said means for dividing comprises means for closing said through holes to present a plurality of small chambers, each containing a separate length of said solution.

5. An apparatus as set forth in claim 3, wherein the soft hollow tube is transparent.

6. An apparatus as set forth in claim 3, wherein the soft hollow tube is composed of a material having a low water permeability.

7. An apparatus as set forth in claim 3, wherein the soft hollow tube is composed of a tetrafluoroethylene/perfluoroalkyl vinyl ether copolymer, a tetrafluoroethylene/hexafluoropropylene copolymer, polyvinylidene fluoride, polyvinyl fluoride, or polytetrafluoroethylene.

8. An apparatus as set forth in claim 7, wherein the tube wall has a thickness of 0.2 to 2.0 mm.

9. An apparatus as set forth in claim 3, wherein the soft hollow tube is composed of a tetrafluoroethylene/ethylene copolymer, polytrifluorochloroethylene, or a trifluorochloroethylene/ethylene copolymer.

10. An apparatus as set forth in claim 9, wherein the tube wall has a thickness of 0.2 to 1.0 mm.

* * * * *